(12) United States Patent
Kison et al.

(10) Patent No.: US 6,784,669 B2
(45) Date of Patent: Aug. 31, 2004

(54) ELECTRICAL CIRCUIT ARRANGEMENT FOR CONVERTING AN ELECTRICAL INPUT VARIABLE INTO AN IMPRESSED OUTPUT ELECTRICAL VOLTAGE

(75) Inventors: Thomas Kison, Lohr am Main (DE); Alexander Meisselbach, Rieneck (DE)

(73) Assignee: Bosch Rexroth AG, Lohr/Main (DE)

( * ) Notice: Subject to any disclaimer, the term of this patent is extended or adjusted under 35 U.S.C. 154(b) by 11 days.

(21) Appl. No.: 10/149,510

(22) PCT Filed: Dec. 2, 2000

(86) PCT No.: PCT/EP00/12138

§ 371 (c)(1),
(2), (4) Date: Oct. 15, 2002

(87) PCT Pub. No.: WO01/51936

PCT Pub. Date: Jul. 19, 2001

(65) Prior Publication Data

US 2003/0057930 A1 Mar. 27, 2003

(30) Foreign Application Priority Data

Jan. 15, 2000 (DE) .......................... 100 01 530

(51) Int. Cl.[7] .............................. G01R 27/02
(52) U.S. Cl. ...................... 324/607; 324/712
(58) Field of Search .............. 324/74, 600, 607, 324/712; 331/25; 706/38

(56) References Cited

U.S. PATENT DOCUMENTS 4,220,895 A * 9/1980 Nuver ...................... 315/195
5,012,181 A 4/1991 Eccleston .................. 324/74

FOREIGN PATENT DOCUMENTS

EP 0724161 7/1996

OTHER PUBLICATIONS

Graeme J: "Phase Compensation Counteracts OP–AMP Input Capacitance" EDN Electrical Design News, US. Cahners Publishing CO. Newton. Massachusetts, vol. 39, No. 1, Jan. 6, 1994.

* cited by examiner

Primary Examiner—N. Le
Assistant Examiner—Walter Benson
(74) Attorney, Agent, or Firm—Martin A. Farber

(57) ABSTRACT

An electrical voltage arrangement to be provided with selectively different electrical input variables, for example in the form of a unidirectional voltage, a bidirectional voltage or a unidirectional current, can be converted into an impressed electrical output voltage. At the same time, there is to be a predefined relationship between the input variable and the output voltage. The circuit arrangement contains a first arithmetic circuit which converts a voltage fed to it into a first impressed voltage, and a second arithmetic circuit which converts an input voltage fed to it into a second impressed voltage. The voltage which is present at the input terminals of the circuit arrangenent is fed to the first arithmetic circuit. The voltage which drops across a resistor which can be connected to the input terminals of the circuit arrangement is fed to the second arithmetic circuit. If the input variable which is to be converted is a voltage, the output voltage of the first arithmetic circuit is used as an output voltage of the circuit arrangement. If the input variable which is to be converted is a current, the current is fed to the resistor, and the output voltage of the second arithmetic circuit is used as the output voltage of the circuit arrangement. The circuit arrangement is provided for use in automation equipment.

14 Claims, 3 Drawing Sheets

ELECTRICAL CIRCUIT ARRANGEMENT FOR CONVERTING AN ELECTRICAL INPUT VARIABLE INTO AN IMPRESSED OUTPUT ELECTRICAL VOLTAGE

FIELD AND BACKGROUND OF THE INVENTION

The invention relates to an electrical circuit arrangement for converting an electrical input variable (voltage or current) into an impressed electrical output voltage, there being a predefined relationship between the input variable and the output voltage.

In automation equipment, actual values and setpoint values, as well as control signals, are being increasingly linked by microprocessors. In many cases, the actual values and setpoint values are present as analog signals, for example in the form of electrical voltages or currents. As microprocessors can only process digital signals, the analog signals must be digitized before they can be processed by the microprocessor. The digitization is usually carried out in such a way that an analog/digital converter converts an electrical voltage between 0 V and +5 V into a digital signal which is suitable for processing by a microprocessor. A voltage of 0 V in this case corresponds to a signal value of 0%, and a voltage of +5 V corresponds to a signal value of 100%. In order also to process voltages with a different signal range, for example from 0 V to +10 V or from −10 V to +10 V, or currents with a signal range from for example 0 mA to 20 mA, the signals must have previously been converted into the signal range of 0 V to +5 V which is provided for the analog/digital conversion. For this purpose, depending on the application case, circuit arrangements are used which convert a voltage into a voltage, or circuit arrangements which convert a current into a voltage. It is thus necessary to stock respective different circuit arrangements for the different electrical input variables.

SUMMARY OF THE INVENTION

The invention is based on the object of providing a circuit arrangement of the type mentioned at the beginning which makes it possible to convert the electrical input variables with different signal ranges into an impressed output voltage for a common signal range.

The invention brings about a reduction in the variety of types and thus lowers the costs for stockkeeping. Futhermore, it is also possible later to use actual value transmitters which have a different signal range from the originally provided actual value transmitters. In this case, the same circuit arrangement can continue to be used to convert the input variable.

Advantageous developments relate to refinements for the advantageous circuit implementation of the circuit arrangement according to the invention.

BRIEF DESCRIPTION OF THE DRAWINGS

The invention is explained in more detail below with its further details by reference to an exemplary embodiment illustrated in the drawings. In said drawings.

DETAILED DESCRIPTION OF THE PREFERRED EMOBODIMENT

In the figures, identical components are provided with identical reference symbols.

Figure 1:
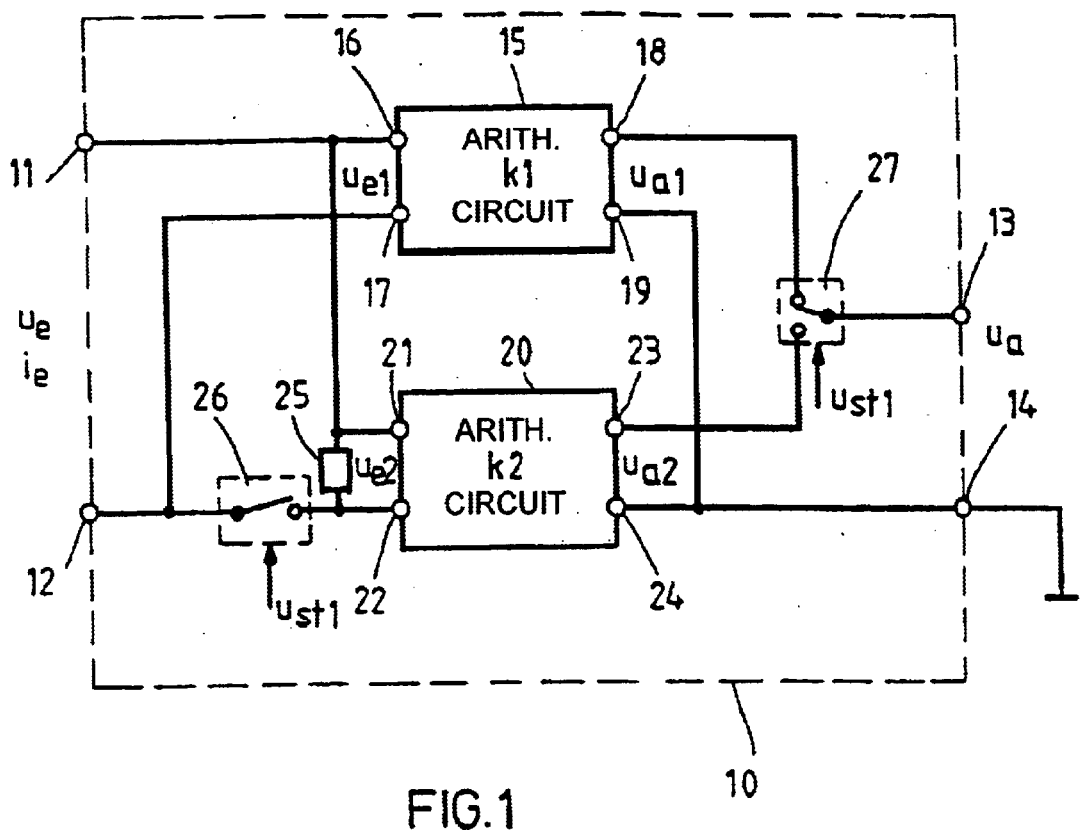
FIG. 1 shows a basic circuit diagram of the circuit arrangement according to the invention.

FIG. 1 shows the basic circuit diagram of an electrical circuit arrangement 10. The circuit arrangement 10 converts an electrical input variable which is present as a voltage ue or as a current ie into an impressed output voltage ua which is proportional to the respective input variable. The input voltage ue or the current ie are fed to the circuit arrangement 10 via input terminals 11 and 12. The output voltage ua is present at output terminals 13 and 14. The output terminal 14 is connected to reference potential. A first arithmetic circuit 15 with input terminals 16 and 17 and output terminals 18 and 19 converts a voltage ue1 fed to it into an impressed voltage ua1. The gain factor of the arithmetic circuit 15 is designated by k1, and the relationship ua1=k1×ue1 therefore applies. The voltage ue present at the input terminals 11 and 12 is fed to the arithmetic circuit 15. The details of the arithmetic circuit 15 are described further below with reference to FIGS. 2 and 3. A second arithmetic circuit 20 with input terminals 21 and 22 and output terminals 23 and 24 converts a voltage ue2 fed to it into an impressed voltage ua2. The gain factor of the arithmetic circuit 20 is designated by k2, and the relationship ua2=k2×ue2 therefore applies. The arithmetic circuit 20 is fed the voltage ue2 which drops across a resistor 25. The resistor 25 is connected via a switch 26 to the input terminals 11 and 12. If the switch 26 is closed, the current ie flows across the resistor 25 and the voltage ue2 which drops across the resistor 25 is proportional to the current ie. Details of the arithmetic circuit 20 are described further below with reference to FIGS. 2 and 4. A changeover switch 27 connects, as a function of its switched setting, the output terminal 18 of the arithmetic circuit 15 or the output terminal 23 of the arithmetic circuit 20 to the output terminal 13 of the circuit arrangement 10. The output terminal 19 of the arithmetic circuit 15 and the output terminal 24 of the arithmetic circuit 20 and the output terminal 14 of the circuit arrangement 10 are connected to one another and are at reference potential. The switch 26 and the changeover switch 27 are illustrated as controlled switches whose switched settings are determined by a control voltage ust1. However, it is also possible to implement the switch 26 and/or the changeover switch 27 in the form of bridges, for example solder bridges or plug-in bridges. In this case no control voltage is necessary.

If the electrical input voltage which is to be converted into the voltage ua is a voltage ue, the control voltage ust1 is selected in such a way that the switch 26 is opened and the changeover switch 27 connects the output terminal 18 to the output terminal 13. In this case, the voltage ua is equal to the voltage ua1. For the relationship between the output voltage ua and the voltage ue, the relationship ua=k1×ue applies.

If the electrical input variable which is to be converted into the voltage ua is a current ie, the control voltage ust1 is selected in such a way that the switch 26 is closed and the changeover switch 27 connects the output terminal 23 to the output terminal 13. In this case, the voltage ua is equal to the voltage ua2. For the relationship between the output voltage ua and the current ie the following relationship applies: ua=k2×R25×ie, the value of the resistor 25 which converts the current ie into the voltage ue2 being designated by R25.

Figure 2:
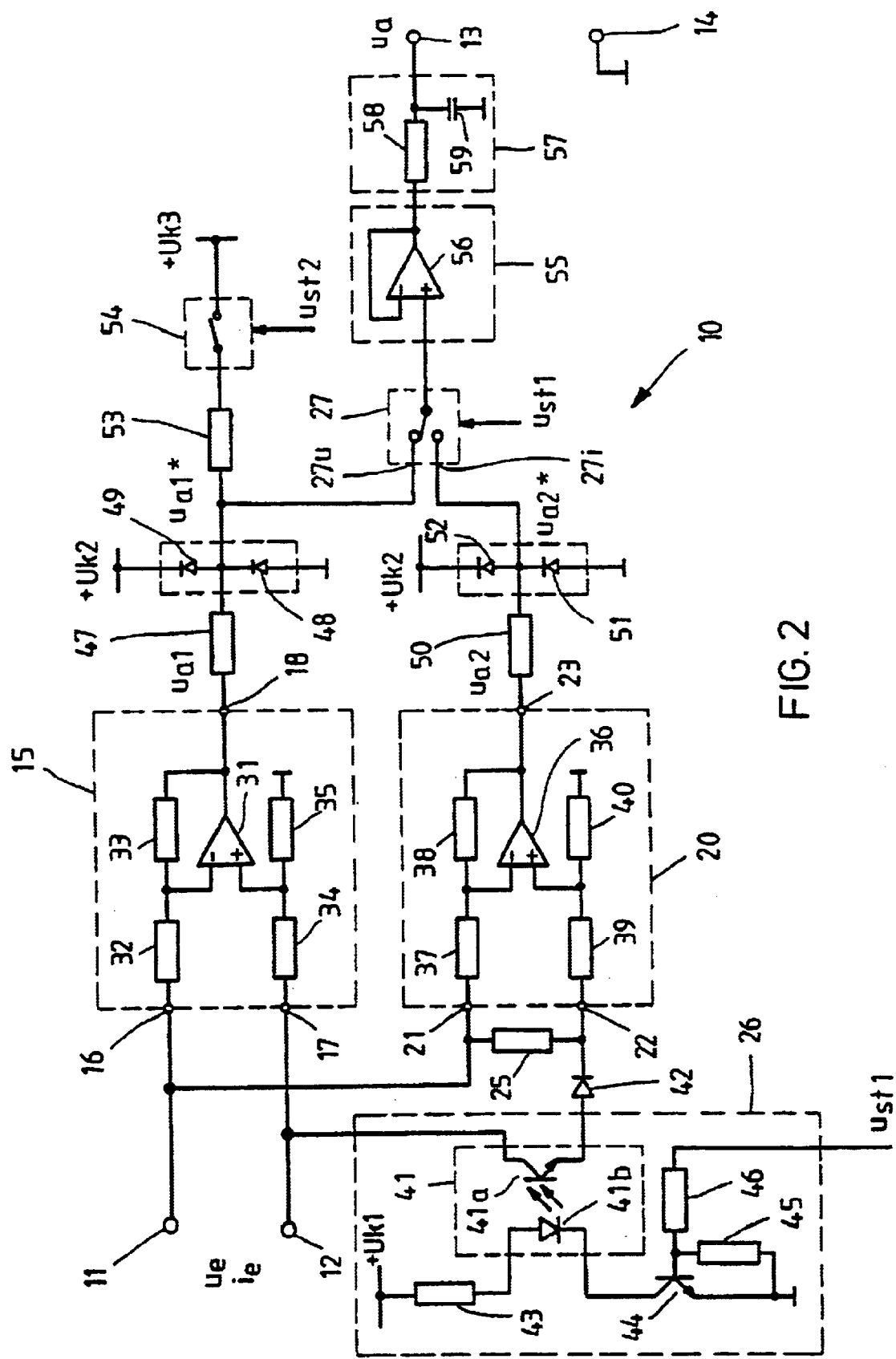
FIG. 2 shows a detailed circuit diagram of the circuit arrangement illustrated in FIG. 1.

FIG. 2 shows a detailed circuit diagram of the circuit arrangement 10 illustrated in FIG. 1. The arithmetic circuit 15 contains an operational amplifier 31 whose output is connected to the output terminal 18. The series circuit of two resistors 32 and 33 is arranged between the input terminal 16 and the output of the operational amplifier 31. The connecting point of the resistors 32 and 33 is connected to the inverting input of the operational amplifier 31. The series circuit of two resistors 34 and 35 is arranged between the input terminal 17 and reference potential. The connecting point of the resistors 34 and 35 is connected to the non-inverting input of the operational amplifier 31. The output voltage ua1 of the arithmetic circuit 15 is set at such a level that the voltage fed to the inverting input of the operational amplifier 31 is equal to the voltage present at the non-inverting input of the operational amplifier 31. The gain factor k1 of the arithmetic circuit 15 is determined by the values of the resistors 32 to 35. In the present exemplary embodiment, the resistors 33 and 35 are of equal size, and the resistors 32 and 34 are each twice as large as the resistors 33 and 35. The gain factor k1 obtained with this wiring of the operational amplifier 31 is k1=0.5.

The arithmetic circuit 20 has basically the same design as the arithmetic circuit 15. The arithmetic circuit 20 contains an operational amplifier 36 whose output is connected to the output terminal 23. The series circuit of two resistors 37 and 38 is arranged between the input terminal 21 and the output of the operational amplifier 36. The connection point of the resistors 37 and 38 is connected to the inverting input of the operational amplifier 36. The series circuit of two resistors 39 and 40 is arranged between the input terminal 22 and reference potential. The connecting point of the resistors 39 and 40 is connected to the non-inverting input of the operational amplifier 36. The output voltage ua2 of the series circuit 20 is set at such a level that the voltage fed to the inverting input of the operational amplifier 36 is equal to the voltage present at the non-inverting input of the operational amplifier 36. The gain factor k2 of the arithmetic circuit 15 is determined by the values of the resistors 37 to 40. In the present exemplary embodiment, the resistors 33 and 40 are of equal size, they are each 2.5 times as large as the resistors 37 and 39. This wiring of the operational amplifier 36 results in a gain factor k2 of k2=2.5.

The switch 26 illustrated in FIG. 2 has an optocoupler 41 which is illustrated only schematically and has a phototransistor 41a and a light emitting diode 41b. If current flows via the light emitting diode 41b, it lights up and drives the phototransistor 41a into the conductive state. In the conductive state, the phototransistor 41a connects the input terminal 12 of the circuit arrangement 10 to one of the terminals of the resistor 25 via a diode 42. The diode 42 prevents current flowing from the input terminal 11 of the circuit arrangement 10 to the input terminal 12 if the voltage at the input terminal 11 is higher than the voltage at the input terminal 12. The light emitting diode 41b is arranged between a resistor 43 and a transistor 44. Two resistors 45 and 46 form a voltage divider whose tap is connected to the base of the transistor 44. If a positive control voltage ust1 is fed to the resistor 46, the transistor 44 switches on, current flows via the light emitting diode 41b from a constant voltage Uk1 via the resistor 43 and the transistor 44, and the light emitting diode 41b switches the phototransistor 41a into the conductive state. The resistor 43 limits the current flowing via the light emitting diode 41b, and also the current flowing via the phototransistor 41a permits the current amplification of the optocoupler 41. The control voltage ust1 and the voltage Uk1 are each selected as +5 V in this exemplary embodiment. If the control voltage ust1 is zero, the transistor 44 switches off and the phototransistor 41a also switches off.

The inputs of the changeover switch 27 are designated below by 27u and 27i. The input 27u is connected via a resistor 47 to the output terminal 18 of the arithmetic circuit 15. In addition, the input 27u is connected to reference potential via a diode 48 and to a constant voltage Uk2 via a further diode 49. The diodes 48 and 49 limit, together with the resistor 47, the voltage which is present at the input 27u and is designated below by ua1*. In a corresponding way, the voltage which is fed to the input 27i of the changeover switch 27 and is designated below by ua2* is limited by a resistor 50 and two diodes 51 and 52. The two limiting circuits prevent the voltages ua1* and ua2* being higher than the total of the voltage Uk2 and the conducting state voltage of the diodes 49 and 52 or more negative than the conducting state voltage of the diodes 48 and 51.

The input 27u of the changeover switch 27 is additionally connected to a constant voltage Uk3 via a resistor 53 and a switch 54. The switched setting of the switch 54 is determined by a second control voltage ust2. When the switch 54 is closed, the resistors 47 and 53 form a voltage divider which is supplied at one of its ends with the voltage ua1 and at the other end with the voltage Uk3.

Electronic analog switches which are driven by a low-power digital control signal are used as changeover switch 27 and switch 54. In the component which is marketed by the company National Semiconductor under the designation CD4053BM/CD4053BC, three electronic changeover switches are combined in one common housing. Such a component requires less space on the circuit board. The changeover switches have a low level of susceptibility to faults because they do not contain any mechanical contacts which can be subject to wear in the course of time. The control voltages ust1 and ust2 serve as digital control signals. In the exemplary embodiment illustrated here, the changeover switch 27 and the switch 54 assume the switched settings shown at ust1=0 V and ust2=0 V, respectively. At ust1=+5 V and ust2=+5 V the changeover switch 27 and the changeover switch 54, respectively, assume the other switched setting.

An impedance converter 55 is connected downstream of the changeover switch 27. The impedance converter 55 is composed of an operational amplifier 56 whose output is connected to its inverting input and whose non-inverting input is at the voltage ua1* or ua2* as a function of the setting of the changeover switch 27. Owing to the high input resistance of the impedance converter 55 there is then virtually no loading of the voltages ua1* or ua2*.

A filter 57, which is formed from a resistor 58 and a capacitor 59, is connected downstream of the impedance converter 55. The filter 57 ensures that the output voltage ua of the circuit arrangement 10 is smooth.

For the conversion of a unidirectional input voltage with a value range of for example 0 V to +10 V into a unidirectional output voltage with a value range of 0 V to +5 V, the switches 26 and 54 are opened and the changeover switch 27 conducts the voltage ua1* to the impedance converter 55. In addition, the input terminal 11 of the circuit arrangement 10 is connected to reference potential. The positive voltage is therefore present at the input terminal 12. Owing to the relationship ua1=k1×ue1, a value range of 0 V to +5 V is obtained for the voltage ua1 when k1=0.5. Owing to the high input resistance of the impedance converter 55, no current flows via the resistor 47 and the voltage ua1* is equal to the voltage ua1. If the voltage Uk2 is selected to be equal to +5 V, no limiting of the voltage ua1* takes place for a value range of 0 V to +5 V. The output voltage ua of the circuit arrangement 10 is the voltage ua1* smoothed by the filter 57. The input terminal 21 of the arithmetic circuit 20 is connected to reference potential. As the switch 26 is opened, no current flows via the resistor 25, i.e. the input terminal 22 of the arithmetic circuit is also at reference potential. Owing to the relationship ua2=k2×ue2, the voltage ua2 becomes zero when k2=2.5. As no current flows via the resistor 50, ua2*=0 V also applies. This value lies within the response limits of the limiting circuit formed from the resistor 50 and the diodes 51 and 52. For the conversion of a bidirectional input voltage with a value range of for example −10 V to +10 V into a unidirectional output voltage with a value range of 0 V to +5 V, the switch 26 is opened, the switch 54 is closed and the changeover switch 27 feeds the voltage ua1* to the impedance converter 55. In addition, the input voltage 11 of the circuit arrangement 10 is connected to reference potential. A voltage which can assume both positive and negative values is present at the input terminal 12. Owing to the relationship ua1=k1×ue1, a value range of −5 V to +5 V results for the voltage ua1 when k1=0.5. When the switch 54 is closed, the resistors 47 and 53 form a voltage divider which is supplied with the voltage ua1 by the arithmetic circuit 15, and whose other side is fed the voltage Uk3. With Uk3=+5 V and resistors 47 and 53 which are selected to have the same size, a value range of the voltage ua1* of 0 V to +5 V is obtained for the value range of the voltage ua1 of −5 V to +5 V. Owing to the high input resistance of the impedance converter 55, there is no loading of the voltage divider formed from the resistors 47 and 53 by the following circuit parts. If the voltage Uk2 is selected—as stated above—to be equal to +5 V, there is no limiting of the voltage ua1* for a value range from 0 V to +5 V. The output voltage ua of the circuit arrangement 10 is the voltage ua1* smoothed by the filter 57. As in the previously treated case of the conversion of a unidirectional voltage, the input terminal 21 of the arithmetic circuit 20 is connected to reference potential. Since the switch 26 is open, no current flows via the resistor 25, i.e. the input terminal 22 of the arithmetic circuit is also at reference potential. Owing to the relationship ua2=k2× ue2, the voltage ua2 becomes zero when k2=2.5. Since no current flows via the resistor 50, ua2*=0 V also. This value is thus also within the response thresholds of the limiting circuit formed from the resistor 50 and the diodes 51 and 52.

For the conversion of a unidirectional input current ie with a value range of for example 0 mA to +20 mA into a unidirectional output voltage with a value range of 0 V to +5 V, the switch 26 is closed and the changeover switch 27 feeds the voltage ua2* to the impedance converter 55. The current ie flows from the input terminal 12 via the phototransistor 41a, the diode 42 and the resistor 25 to the input terminal 11 of the circuit arrangement 10. Given a resistance value of R25=100Ω, the voltage ue2, whose voltage range is between 0 V and 2 V, drops across the resistor 25. Owing to the relationship ua2=k2×ue2, a value range of 0 V to +5 V is obtained for the voltage ua2 when k2=2.5. Owing to the high input resistance of the impedance converter 55, no current flows via the resistor 50 and the voltage ua2* is equal to the voltage ua2. If the voltage Uk2 is selected to be equal to +5 V, no limiting of the voltage ua2* takes place for the value range from 0 V to +5 V. The output voltage ua of the circuit arrangement 10 is the voltage ua2* smoothed by the filter 57. The voltage drop across the resistor 25 which is increased by a forward voltage of the diode 42 is fed to the input terminals 16 and 17 of the arithmetic circuit 15 as input voltage ue1. If the silicon diode with a forward voltage of the diode 42 of 0.7 V is assumed when there is a flow of current, a value range of 0 V to 2.7 V is obtained for the input voltage ue1 of the arithmetic circuit 15. Owing to the relationship ua1=k1×ue1 where k1=0.5, the voltage ua1 assumes values in the range from 0 V to 1.35 V. Irrespective of the setting of the switch 54, the range of the voltage ua1* lies within the response limits of the limiting circuit formed from the resistor 47 and the diodes 48 and 49.

If the switch 26 is closed inadvertently or owing to a fault when there is a positive voltage at the input terminal 12, the current flowing via the photoresistor 41a, the diode 42 and the resistor 25 is, as described above, limited, so that in the case of a fault there is no risk of damage to components of the circuit arrangement. In addition, the voltage ua2* is limited by the resistor 50 and the diode 52 connected to the voltage Uk2. When a silicon diode is used, the voltage ua2* is limited to approximately 5.7 V and to approximately 5.3 V in the case of a germanium diode. Here, the forward voltage of a silicon diode with 0.7 V and the forward voltage of a germanium diode with 0.3 V are taken into account. When germanium diodes are used, a voltage which can assume values between −0.3 V and 5.3 V is thus present at the input 27i of the changeover switch 27. The use of germanium diodes is advantageous in particular if a microprocessor is connected to the terminals 13 and 14. The diode 42 prevents a flow of current via the resistor 25 and via the phototransistor 41a if a voltage which is negative with respect to the input terminal 11 is present at the input terminal 12 of the circuit arrangement 10. As no current flows via the resistor 25 in this case, the input terminals 21 and 22 of the arithmetic circuit 20 are virtually at reference potential and the voltage ua2 is zero. If an electronic analog switch is used as changeover switch 27, it is necessary that its inputs are not supplied with a voltage which is more negative than its negative supply voltage.

Figure 3:
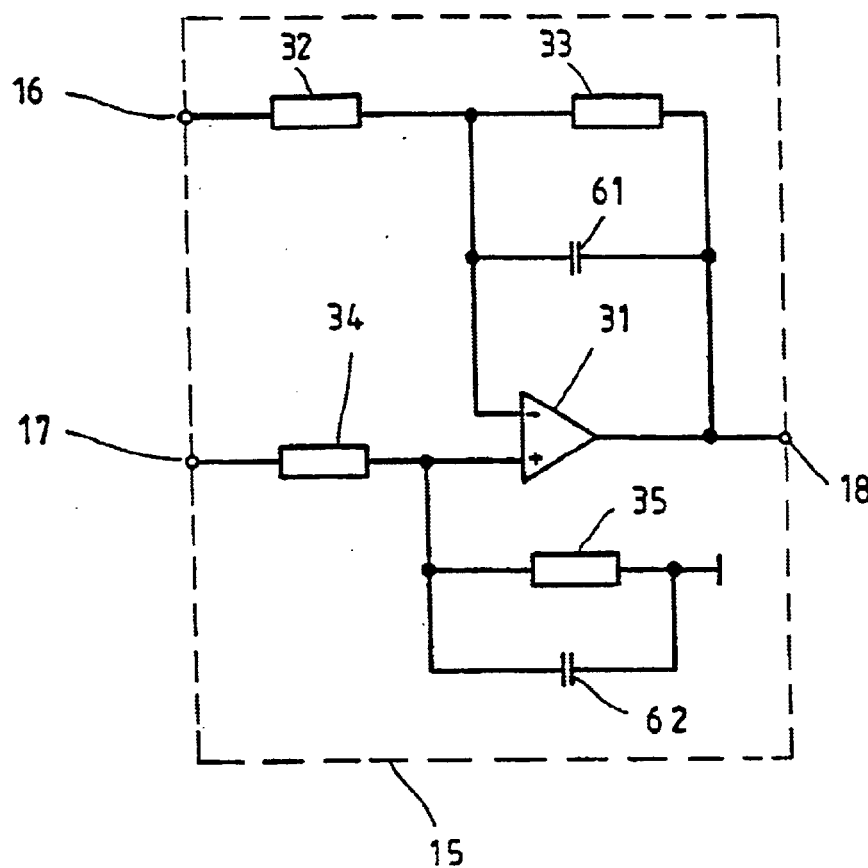
FIG. 3 shows a refinement of the first arithmetic circuit.

FIG. 3 shows an extension of the arithmetic circuit 15 illustrated in FIG. 2. A capacitor 61 is arranged parallel to the resistor 33. A further capacitor 62 is arranged parallel to the resistor 35. The additionally provided capacitors 61 and 62 are used to smooth the output voltage ua1 of the arithmetic circuit 15.

Figure 4:
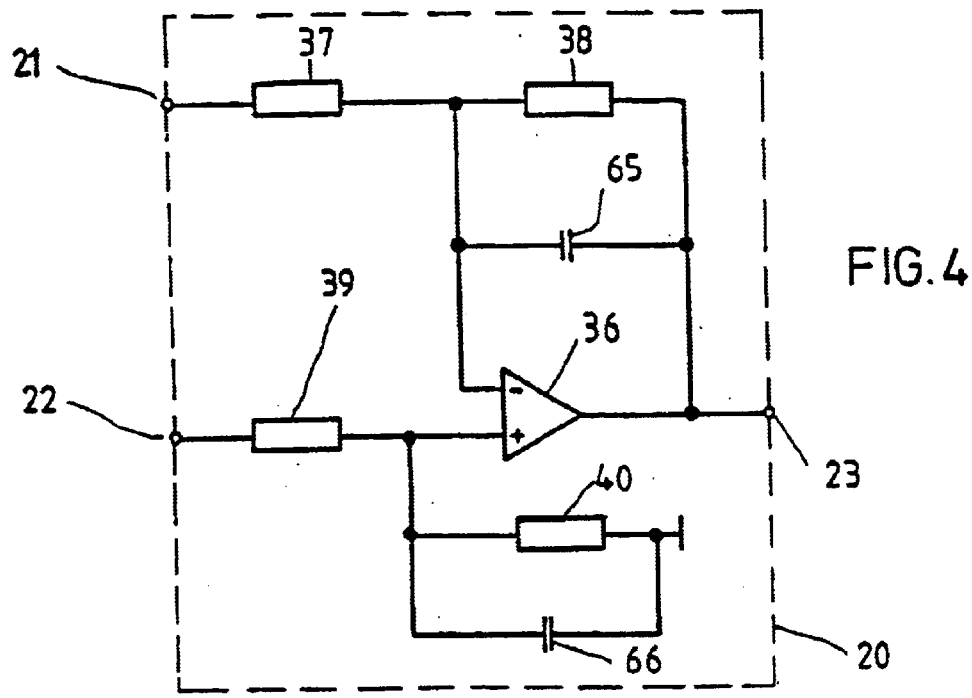
FIG. 4 shows a refinement of the second arithmetic circuit.

FIG. 4 shows an extension of the arithmetic circuit 20 illustrated in FIG. 2. The extension of the arithmetic circuit 20 is constructed in a way corresponding to the extension of the extension of the arithmetic circuit 15 illustrated in FIG. 3. A capacitor 65 is arranged parallel to the resistor 38. A further capacitor 66 is arranged parallel to the resistor 40. The additionally provided capacitors 65 and 66 are used to smooth the output voltage ua2 of the arithmetic circuit 20.

Figure 5:
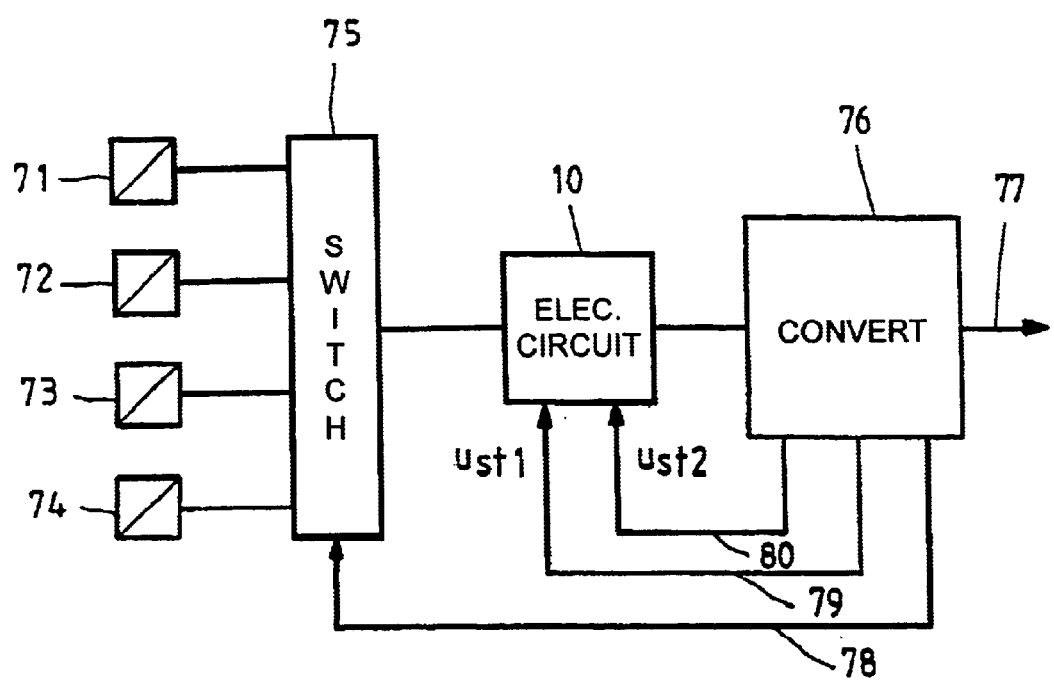
FIG. 5 shows the block circuit diagram of a device for automatically sensing and evaluating measured values with a circuit arrangement according to the invention.

FIG. 5 shows, as an application example of the circuit arrangement according to the invention, a device for the automated sensing and evaluation of a series of different measured values as a block circuit diagram. The values which are to be measured, for example pressure, differential pressure, travel or temperature, are converted into electrical signals by measuring converters 71 to 74. Depending on the design of the measuring converters, the electrical output signal is a unidirectional voltage, a bidirectional voltage or a unidirectional current. An electronic changeover switch 75 selects in each case one of these electrical signals. The circuit arrangement 10 according to the invention converts the electrical signal selected by the electronic changeover switch 75 into a unidirectional voltage with a uniform value range of—as described above—for example 0 V to +5 V. This voltage is fed to a measured value processing device 76 which converts the value range from 0% to 100% of the measured value fed to it into the corresponding physical unit. The measured value can be displayed and/or indicated. It can also be passed on via an information channel 77. The information channel 77 can be of an analog or digital type here. The interrogation of the individual measured values can be carried out under program control. For this purpose, a control signal, which is used to select the desired measurement variable, is fed to the changeover switch 75 by the device 76 via a signal line 78. At the same time, control signals ust1 and ust2 which set the switches 26 and 54 and the changeover switch 27 of the circuit arrangement 10 in accordance with the transmission behavior necessary for the selected measurement variable are fed to the circuit arrangement 10 via further signal lines 79 and 80.

What is claimed is:

1. Electrical circuit arrangement for converting an electrical input variable (voltage or current) into an impressed electrical output voltage, there being a predefined relationship between the input variable and the output voltage, wherein a first arithmetic circuit (15) is provided which converts a voltage (ue1) fed therein in a first impressed voltage (ua1), a second arithmetic circuit (20) is provided which converts an input voltage (ue2) fed thereto into a second impressed voltage (ua2), a voltage (ue) present at input terminals (11, 12) of the circuit arrangement (10) is fed to the first arithmetic circuit (15), the voltage (ue2) which drops across a resistor (25) which is connectable to the input terminals (11, 12) of the circuit arrangement (10) is fed to the second arithmetic circuit (20), for conversion of voltage (ue), output voltage (ua1) of the first arithmetic circuit (15) is used as output voltage (ua) of the circuit arrangement (10), and for conversion of a current (ie), the current (ie) is fed to the resistor (25) and output voltage (ua2) of the second arithmetic circuit (20) is used as the output voltage (ua) of the circuit arrangement (10), wherein the resistor (25) is connected to the input terminals (11, 12) of the circuit arrangement (10) via a switch (26), a changeover switch (27) connects output (18 or 23) of arithmetic circuit (15, 20) to output (13) of the circuit arrangement (10), for conversion of a voltage ($u_e$), the switch (26) is opened and the changeover switch (27) feeds the output voltage (ua1) of the first arithmetic circuit (15) to the output (13) of the circuit arrangement (10), and for conversion of a current ($i_e$), the switch (26) is closed and the changeover switch (27) feeds the output voltage (ua2) of the second arithmetic circuit (20) to the output (13) of the circuit arrangement (10).

2. The circuit arrangement as claimed in claim 1, wherein an impedance converter (55) is arranged between output of the changeover switch (27) and the output (13) of the circuit arrangement (10).

3. The circuit arrangement as claimed in claim 2, wherein a filter (57) is connected downstream of the impedance converter (55).

4. The circuit arrangement as claimed in claim 1, wherein the first-mentioned switch (26) has an optocoupler (41).

5. The circuit arrangement as claimed in claim 4, wherein a diode (42) is arranged between the optocoupler (41) and the first-mentioned resistor (25).

6. The circuit arrangement as claimed in claim 1, wherein the changeover switch (27) is an electronic analog switch.

7. The use of a circuit arrangement as claimed in claim 1, in which the first-mentioned switch (26) provided for setting transmission behavior of the circuit arrangement and changeover switch (27) are controllable by electrical signals (ust1, ust2) in order to adapt different input signals (ue, ie) in a device for automatically sensing and evaluating measured values.

8. Electrical circuit arrangement for converting an electrical input variable (voltage or current) into an impressed electrical output voltage, there being a predefined relationship between the input variable and the output voltage, wherein a first arithmetic circuit (15) is provided which converts a voltage (ue1) fed therein in a first impressed voltage (ua1), a second arithmetic circuit (20) is provided which converts an input voltage (ue2) fed thereto into a second impressed voltage (ua2), a voltage (ue) present at input terminals (11, 12) of the circuit arrangement (10) is fed to the first arithmetic circuit (15), the voltage (ue2) which drops across a resistor (25) which is connectable to the input terminals (11, 12) of the circuit arrangement (10) is fed to the second arithmetic circuit (20), for conversion of voltage (ue), output voltage (ua1) of the first arithmetic circuit (15) is used as output voltage (ua) of the circuit arrangement (10), and for conversion of a current (ie), the current (ie) is fed to the resistor (25) and output voltage (ua2) of the second arithmetic circuit (20) is used as the output voltage (ua) of the circuit arrangement (10), wherein the first arithmetic circuit (15) has a first operational amplifier (31), an inverting input of the first operational amplifier (31) is connected to its output via a second resistor (33), and to a first input terminal (16) of the first arithmetic circuit (15) via a third resistor (32), a non-inverting input of the first operational amplifier (31) is connected to reference potential (i) via a fourth resistor (35), and to a second input terminal (17) of the first arithmetic circuit (15) via a fifth resistor (34), the second arithmetic circuit (20) has a second operational amplifier (36), an inverting input of the second operational amplifier (36) is connected to its output via a sixth resistor (38) and to a first input terminal (21) of the second arithmetic circuit (20) via a seventh resistor (37), and a non-inverting input of the second operational amplifier (36) is connected to reference potential (i) via an eighth resistor (40) and to a second input terminal (22) of the second arithmetic circuit (20) via a ninth resistor (39).

9. The circuit arrangement as claimed in claim 8, wherein the resistors (32 to 35; 37 to 40) which are connected to the inputs of the operational amplifiers (31, 36) are dimensioned according to desired relationship between input variable (ue, ie) and the output voltage (ua).

10. The circuit arrangement as claimed in claim 9, wherein a capacitor (61, 62, 65, 66) is arranged in each case in parallel with the second resistor (33), the fourth resistor (35), the sixth resistor (38) and the eighth resistor (40).

11. Electrical circuit arrangement for converting an electrical input variable (voltage or current) into an impressed electrical output voltage, there being a predefined relationship between the input variable and the output voltage, wherein a first arithmetic circuit (15) is provided which converts a voltage (ue1) fed therein in a first impressed voltage (ua1), a second arithmetic circuit (20) is provided which converts an input voltage (ue2) fed thereto into a second impressed voltage (ua2), a voltage (ue) present at input terminals (11, 12) of the circuit arrangement (10) is fed to the first arithmetic circuit (15), the voltage (ue2) which drops across a resistor (25) which is connectable to the input terminals (11, 12) of the circuit arrangement (10) is fed to the second arithmetic circuit (20), for conversion of voltage (ue), output voltage (ua1) of the first arithmetic circuit (15) is used as output voltage (ua) of the circuit arrangement (10), and for conversion of a current (ie), the current (ie) is fed to the resistor (25) and output voltage (ua2) of the second arithmetic circuit (20) is used as the output voltage (ua) of the circuit arrangement (10), wherein the resistor (25) is connected to the input terminals (11, 12) of the circuit arrangement (10) via a switch (26), a changeover switch (27) connects output (18 or 23) of arithmetic circuit (15, 20) to output (13) of the circuit arrangement (10), output (16) of the first arithmetic circuit (15) is connected to one (27u) of inputs of the changeover switch (27) via a second resistor (47), output (23) of the second arithmetic circuit (20) is connected to other input (27i) of the changeover switch (27) via a third resistor (50), the one input (27u) of the changeover switch (27) is connected to a first constant voltage (1) via a first diode (48) and to a second constant voltage (Uk2) via a second diode (49), and the other input (27i) of the changeover switch (27) is connected to the first constant voltage (1) via a third diode (51) and to the second constant voltage (Uk2) via a fourth diode (52).

12. The circuit arrangement as claimed in claim 11, wherein the one (27u) of the inputs of the changeover switch (27) is connected to a third constant voltage (Uk3) via a fourth resistor (53) and a second switch (54).

13. The circuit arrangement as claimed in claim 12, wherein the second switch (54) is an electronic analog switch.

14. The use of a circuit arrangement as claimed in claim 12, which switches (26, 54) and the changeover switch (27) which are provided for setting transmission behavior of the circuit arrangement are controlable by electrical signals (ust1, ust2) in order to adapt different input signals (ue, ie) in a device for automatically sensing and evaluating measured values.

* * * * *